(12) United States Patent
Desai et al.

(10) Patent No.: US 9,508,687 B2
(45) Date of Patent: Nov. 29, 2016

(54) LOW COST HYBRID HIGH DENSITY PACKAGE

(71) Applicant: Tessera, Inc., San Jose, CA (US)

(72) Inventors: Kishor Desai, Fremont, CA (US); Qwai H. Low, Cupertino, CA (US); Chok J. Chia, Cupertino, CA (US); Charles G. Woychik, San Jose, CA (US); Huailiang Wei, Allen, TX (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 14/628,894

(22) Filed: Feb. 23, 2015

(65) Prior Publication Data

US 2015/0171058 A1    Jun. 18, 2015

Related U.S. Application Data

(62) Division of application No. 13/216,918, filed on Aug. 24, 2011, now Pat. No. 8,963,310.

(51) Int. Cl.
*H01L 25/065* (2006.01)
*H01L 23/495* (2006.01)
(Continued)

(52) U.S. Cl.
CPC ......... *H01L 25/0657* (2013.01); *H01L 21/568* (2013.01); *H01L 23/3135* (2013.01); *H01L 23/481* (2013.01); *H01L 23/49531* (2013.01); *H01L 23/49541* (2013.01); *H01L 23/49548* (2013.01); *H01L 23/49575* (2013.01); *H01L 23/49811* (2013.01); *H01L 23/49827* (2013.01); *H01L 25/50* (2013.01); *H01L 23/3128* (2013.01); *H01L 24/16* (2013.01); *H01L 24/32* (2013.01); *H01L 24/48* (2013.01); *H01L 24/73* (2013.01); *H01L 2224/16145* (2013.01); *H01L 2224/16225* (2013.01); *H01L 2224/32145* (2013.01); *H01L 2224/48247* (2013.01); *H01L 2224/48464* (2013.01); *H01L 2224/73215* (2013.01); *H01L 2224/73253* (2013.01); *H01L 2224/73265* (2013.01); *H01L 2225/0651* (2013.01); *H01L 2225/06513* (2013.01);
(Continued)

(58) Field of Classification Search
CPC ............... H01L 25/0657; H01L 25/50; H01L 23/49575; H01L 23/49541
See application file for complete search history.

(56) References Cited

U.S. PATENT DOCUMENTS 6,020,218 A    2/2000  Shim et al.
6,593,664 B2   7/2003  Schober et al.
(Continued)

*Primary Examiner* — Joseph C Nicely
(74) *Attorney, Agent, or Firm* — Lerner, David, Littenberg, Krumholz & Mentlik, LLP

(57) ABSTRACT

A microelectronic assembly includes a substrate, a first and second microelectronic elements, a lead finger, electrical connections extending between contacts of the second microelectronic element and the lead fingers, and an encapsulant overlying at least portions of the first and second microelectronic elements, lead finger and electrical connections. The substrate has contacts at a first surface and terminals at an opposed second surface that are electrically connected with the substrate contacts. The first microelectronic element has contacts exposed at its front face. The front face of the first microelectronic element is joined to the substrate contacts. The second microelectronic element overlies the first microelectronic element and has contacts at a front face facing away from the substrate. The lead frame has lead fingers, wherein the second surface of the substrate and the lead fingers define a common interface for electrical interconnection to a component external to the microelectronic assembly.

16 Claims, 11 Drawing Sheets

FIG. 1A

(51) Int. Cl.
  *H01L 23/498* (2006.01)
  *H01L 21/56* (2006.01)
  *H01L 23/48* (2006.01)
  *H01L 25/00* (2006.01)
  *H01L 23/31* (2006.01)
  *H01L 23/00* (2006.01)

(52) U.S. Cl.
  CPC ............. *H01L2225/06517* (2013.01); *H01L 2225/06541* (2013.01); *H01L 2225/06558* (2013.01); *H01L 2225/06562* (2013.01); *H01L 2225/06568* (2013.01); *H01L 2924/15311* (2013.01)

(56) References Cited

U.S. PATENT DOCUMENTS

| | | |
|---|---|---|
| 6,765,287 B1 | 7/2004 | Lin |
| 7,176,506 B2 | 2/2007 | Beroz et al. |
| 7,245,007 B1 | 7/2007 | Foster |
| 7,834,436 B2 | 11/2010 | Chen |
| 7,919,850 B2 | 4/2011 | Trasporto et al. |
| 8,043,894 B2 | 10/2011 | Tay et al. |
| 8,067,827 B2 | 11/2011 | Corisis |
| 8,076,184 B1 | 12/2011 | Camacho et al. |
| 8,148,806 B2 | 4/2012 | Lin et al. |
| 8,169,064 B2 | 5/2012 | Kim |
| 8,389,330 B2 | 3/2013 | Do et al. |
| 8,426,961 B2 * | 4/2013 | Shih .............. H01L 21/486 257/698 |
| 8,587,126 B2 | 11/2013 | Oganesian et al. |
| 8,669,653 B2 | 3/2014 | Oi |
| 2009/0085178 A1 | 4/2009 | Ha et al. |
| 2009/0230517 A1 | 9/2009 | Bathan et al. |
| 2009/0278242 A1 * | 11/2009 | Chuang .......... H01L 23/49548 257/676 |
| 2011/0062599 A1 | 3/2011 | Kim et al. |
| 2011/0180914 A1 | 7/2011 | Do et al. |
| 2011/0215454 A1 * | 9/2011 | Wang ................ H01L 23/495 257/676 |
| 2011/0278707 A1 | 11/2011 | Chi et al. |
| 2011/0298137 A1 * | 12/2011 | Pagaila ............ H01L 21/561 257/773 |
| 2011/0316133 A1 | 12/2011 | Do et al. |
| 2012/0175643 A1 | 7/2012 | West |
| 2012/0193812 A1 * | 8/2012 | Toh .................. H01L 21/561 257/774 |
| 2013/0050972 A1 | 2/2013 | Mohammed et al. |

* cited by examiner

LOW COST HYBRID HIGH DENSITY PACKAGE

CROSS-REFERENCES TO RELATED APPLICATIONS

The present application is a divisional of U.S. patent application Ser. No. 13/216,918, filed on Aug. 24, 2011, the disclosure of which is hereby incorporated herein by reference.

BACKGROUND OF THE INVENTION

The present invention relates to stacked microelectronic assemblies and methods of making such assemblies, and to components useful in such assemblies.

Semiconductor chips are commonly provided as individual, prepackaged units. Each individual chip typically is mounted in a package which, in turn, is mounted on a circuit panel such as a printed circuit board Numerous arrangements exist for providing multiple semiconductor chips into a package. Multi-chip packages often include chips mounted to a substrate in a face-down or flip-chip position or chips wire-bonded to the contacts of a substrate.

Despite the advances that have been made in multi-chip packages, there is still a need for improvements in order to minimize the size and improve the performance of such packages. These attributes of the present invention are achieved by the construction of the microelectronic assemblies as hereinafter described.

BRIEF SUMMARY OF THE INVENTION

In accordance with one aspect of the claimed invention, there is a microelectronic assembly that includes a substrate with first and second opposed surfaces, substrate contacts at the first surface, and terminals at the second surface electrically connected with the substrate contacts. A first microelectronic element has contacts at its front face that face the substrate contacts and are joined thereto. A second microelectronic element may overlie the first microelectronic element and have contacts at a front face facing away from the substrate. There is also a lead frame with lead fingers. The second surface of the substrate and the lead fingers define a common interface for electrical interconnection to a component external to the microelectronic assembly. There may also be electrical connections extending between the contacts of the second microelectronic element and the lead fingers and an encapsulant overlying the electrical connections, the first and second microelectronic elements, the substrate, and at least portions of the lead fingers.

In an alternative embodiment, the electrical connections between the second microelectronic element and the lead fingers are wire bonds.

In another embodiment, the substrate has a coefficient of thermal expansion of less than 10 parts per million per degree Celsius.

In another embodiment, the substrate embodies a plurality of passive devices. Alternatively, the substrate embodies a plurality of active semiconductor devices.

In another alternative embodiment, a first portion of a thickness of the substrate defines a first region in which a plurality of conductive vias extend in a first direction of the thickness of the substrate. No conductive interconnects extend in a lateral direction transverse to the first direction between the conductive vias. A second portion of the thickness may define a second region in which a plurality of conductive traces electrically connected with the conductive vias extend in lateral directions of the substrate transverse to the first direction.

In another embodiment of this aspect of the invention, there is a circuit panel that has contacts at a surface thereof joined with the terminals and the lead fingers.

In another embodiment, the encapsulant is molded to have a planar surface overlying at least a portion of the second microelectronic element.

In one embodiment, surfaces of the lead fingers are co-planar with the second surface of the substrate and a surface of the encapsulant between the substrate and the lead fingers.

In an alternative embodiment, the encapsulant may be a first encapsulant, and there is a second encapsulant overlying the second surface of the substrate, and joining units exposed at a surface of the second encapsulant overlying the second surface. The surfaces of the lead fingers may be co-planar with the surface of the second encapsulant and a surface of the first encapsulant between the substrate and the lead fingers.

In another embodiment, each of the at least some of the lead fingers has a fan-out portion and a substrate connection portion. Each fan-out portion and each substrate connection portion of such lead fingers extend in a common lead finger plane. The fan-out portions have a first thickness in a first direction transverse to the lead finger plane. The substrate connection portions may have a second thickness in the first direction, such that the second thickness is smaller than the first thickness. The substrate connection portions may overly and be joined to the second substrate contacts.

In another embodiment, there is also a third microelectronic element disposed between the first and second microelectronic elements. The third microelectronic element may be electrically connected with the substrate by connections extending through the first microelectronic element.

In another embodiment, there are joining units attached to the terminals.

In another embodiment, one or more third microelectronic elements overlie the second microelectronic element. The one or more third microelectronic element may have contacts exposed at a front face, face away from the front face of the second microelectronic element, and be electrically connected with the lead fingers.

In accordance with another aspect of the present invention, there is a system that comprises the microelectronic assembly of the previously discussed aspect of the present invention, and one or more other electronic components electrically connected with the assembly. Alternatively, the system may further including a housing, wherein the assembly and the other electronic components are mounted to the housing.

In accordance with another aspect of the present invention, there is a method of making a microelectronic assembly that includes electrically joining some contacts of a substrate to respective first lead fingers of a lead frame; aligning and joining element contacts at a front face of a first microelectronic element with corresponding substrate contacts underlying the element contacts; electrically interconnecting contacts at a face of a second microelectronic element facing away from the substrate with second lead fingers of the lead frame; and forming an encapsulant over the first and second microelectronic elements, exposed surfaces of the substrate, and over the electrical connections between the second microelectronic element and the lead fingers. The substrate contacts may face the lead fingers to which they are joined and the substrate may have a plurality of the contacts at a first surface and a plurality of the terminals at a second surface opposed to the first surface.

In an alternative embodiment, there is also a step of preparing an element having contacts at the first surface, terminals at an opposed second surface, and a plurality of conductive vias and circuitry electrically connecting the terminals with the substrate contacts; and a step of dicing the element into a plurality of substrates.

In one embodiment, the element is a wafer element.

In another embodiment, a carrier may be used to support the substrate and lead finger.

In another embodiment, in accordance with this aspect, the carrier is removed after the step of forming an encapsulant.

In another aspect of the present invention, an interconnection subassembly includes a lead frame component, a plurality of substrates, and a removable carrier. The plurality of lead frame elements may be attached to one another in a strip or panel and each lead frame element has lead fingers. A plurality of substrates may have first and second opposed surfaces, substrate contacts at the first surface, and terminals at the second surface that are electrically connected with the substrate contacts. The second surface and the lead fingers may define a common interface for electrical interconnection to a component external to the subassembly. The removable carrier covers the lead fingers and the second surface of the substrates.

In another embodiment, the lead fingers are joined to the substrate contacts.

DETAILED DESCRIPTION

Figure 1:
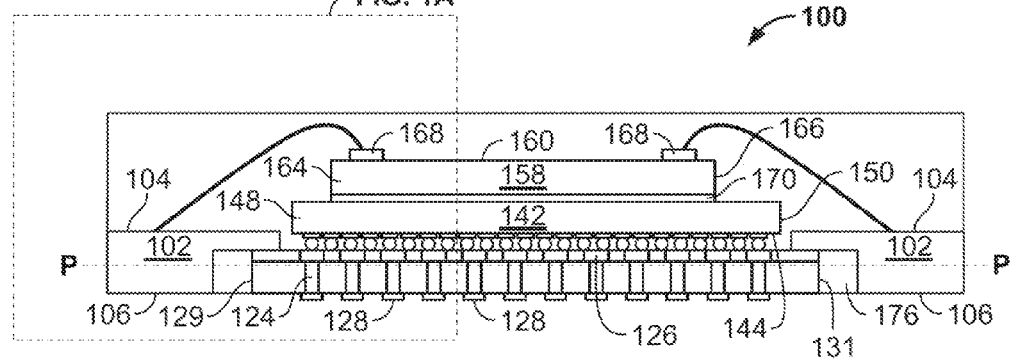
FIG. 1 is a cross-sectional view of one embodiment of the invention.
Figure 1A:
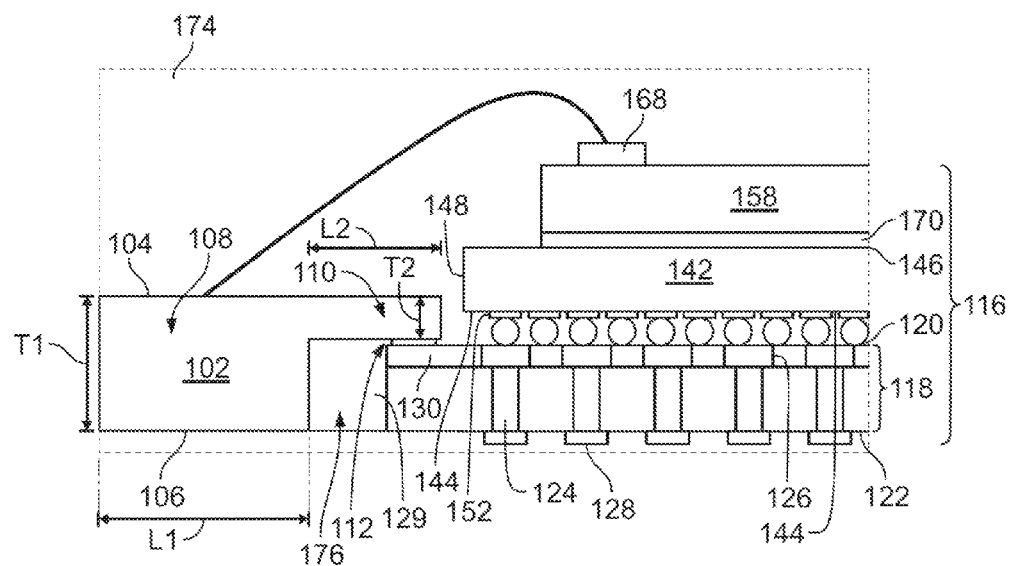
FIG. 1A is a fragmentary cross-sectional view, showing an enlarged view in greater detail of a portion of FIG. 1.

Turning first to FIGS. 1-1A, a microelectronic assembly 100, in accordance with an embodiment of the present invention, is shown. As shown, the microelectronic assembly 100 includes lead fingers 102 of a lead frame that are attached and electrically connected with a microelectronic subassembly 116. The microelectronic subassembly 116 further includes a substrate 118, a first microelectronic element 142, and a second microelectronic element 158. The lead frame, together with the subassembly 116 electrically connected therewith, can form a microelectronic subassembly which can be mounted with an external component such as another microelectronic subassembly or a circuit panel or circuit board, among others.

In certain embodiments, the substrate 118 may include a dielectric element of various types of construction, such as of polymeric material, e.g., polyimide, BT resin, or composite material such as epoxy-glass, e.g., FR-4. In another example, the substrate 118 can consist essentially of glass, ceramic material or a semiconductor material such as silicon, or alternatively include a layer of semiconductor material and one or more dielectric layers thereon. Such glass, ceramic or semiconductor substrate may have a coefficient of thermal expansion of less than 7 parts per million/° C.

As shown, the substrate 118 has a first surface 120, a second surface 122, a first edge 129 (FIG. 1), and a second edge 131. A plurality of conductive vias or thin silicon interconnects 124 extend in a direction between the first and second surfaces 120,122 of the substrate 118. The vias may be formed by known methods, such as, for example, the methods disclosed in a commonly owned application filed on Aug. 23, 2011, and entitled "Interconnection Elements With Encased Interconnects". The substrate 118 can further include one or more metal layers 130 containing electrically conductive elements, e.g., traces, conductive vias (not shown), and conductive pads, such as substrate contacts 126, at or exposed at a surface for interconnection with contacts of a microelectronic assembly, a circuit panel, or the like, for example. As used in this disclosure, a statement that an electrically conductive element is "exposed at" a surface of a structure indicates that the electrically conductive element is available for contact with a theoretical point moving in a direction perpendicular to the surface toward the surface from outside the structure. Thus, a terminal or other conductive element which is exposed at a surface of a structure may project from such surface; may be flush with such surface; or may be recessed relative to such surface and exposed through a hole or depression in the structure. Ends of the conductive vias 124 are electrically connected with substrate contacts 126 exposed at the first surface, and terminals 128 exposed at the second surface 122 of the substrate 118.

The microelectronic elements in the microelectronic subassembly 116 may include microelectronic elements, such as first microelectronic element 142, which may be a semiconductor chip configured predominantly to perform a logic function, such as a microprocessor, application-specific integrated circuit ("ASIC"), field programmable gate array ("FPGA"), microcontroller or other logic chip, among others. The first microelectronic element 142 is shown having a front face 144, a rear surface 146 remote therefrom, and respective first and second edges 148,150, extending between the front and rear surfaces 144,146. In a particular example, there is also a second microelectronic element 158, which can include or be a memory chip having a predominant function such as a flash (NOR or NAND) memory chip, dynamic random access memory ("DRAM") chip, or static random access memory ("SRAM") chip, or be configured predominantly to perform some other function.

Electrical contacts 152 are shown at the front face 144 of the first microelectronic element 142. Electrical contacts 152 may include bond pads or other conductive structures, such as bumps, posts, etc. The bond pads may include one or more metals such as copper, nickel, gold or aluminum, and may be about 0.5 µm thick. The size of the bond pads can vary with the device type but will typically measure tens to hundreds of microns on a side. Electrical contacts 152 may be arranged in parallel rows extending horizontally along the front face of the microelectronic element and may be arranged in an area array. The front face may therefore define horizontal directions substantially parallel to the electrical contacts.

As shown, the first microelectronic element 142 is arranged in a face-down or flip-chip position. The front face 144 of the first microelectronic element 142 faces the first surface 120 of the substrate 118 and the electrical contacts 152 thereof face the substrate contacts 126 and are joined thereto. For example, the contacts 152 of the first microelectronic element 142 and the substrate contacts 126 are joined together by respective solder bumps or ballS 154 or other bond metal. In another example, one or both of the contacts 152,126 can be conductive posts, e.g., solid metal pillars having end surfaces and edge surfaces extending away therefrom, such pillars consisting essentially or copper or copper alloy, for example. A variety of other flip-chip interconnection arrangements are possible, but need not be enumerated here. In an embodiment as seen in FIGS. 1-1A, the first and second edges 148,150 of the first microelectronic element 142 need not extend to or beyond respective first and second edges 129,131 of the substrate 118.

The second microelectronic element 158 overlies the first microelectronic element 142. The second microelectronic element 158 has a front face 160, a rear surface 162 remote therefrom, and first and second edges 164,166 extending between the front face 160 and rear surfaces 162. As shown, the front face 160 of the microelectronic element 158 faces away from the first surface 120 of the substrate 118 and may include electrical contacts 168 exposed at front face 160. The first and second microelectronic elements 142,158 may be attached together using an adhesive material 170. In this embodiment, an adhesive material is provided between the rear surface 162 of the second microelectronic element 158 and the rear surface 146 of the first microelectronic element 142, although any known means of attaching the second microelectronic element 158 to the first microelectronic element 142 may be used.

Figure 5:
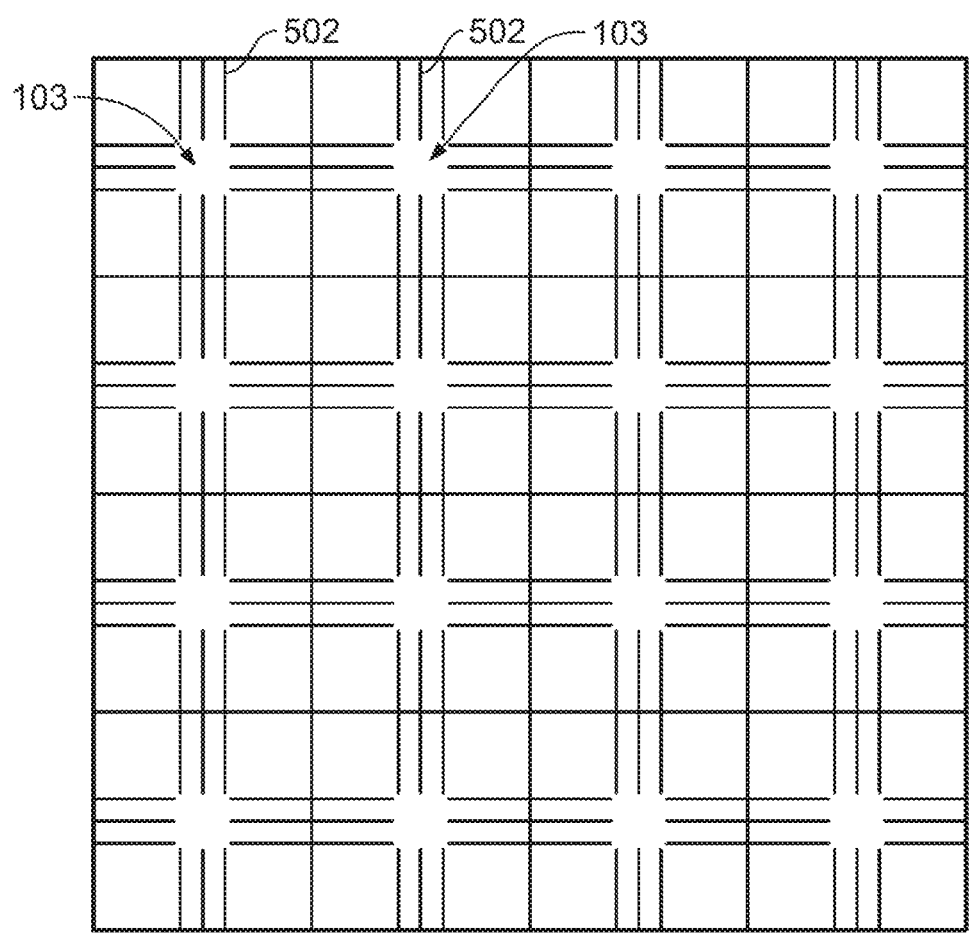
FIGS. 5, 5A, 5B, 5C, 5D, 5E, 5F, and 5G illustrate a method of making the embodiment of FIG. 1 in accordance with an embodiment of the present invention.
Figure 5A:
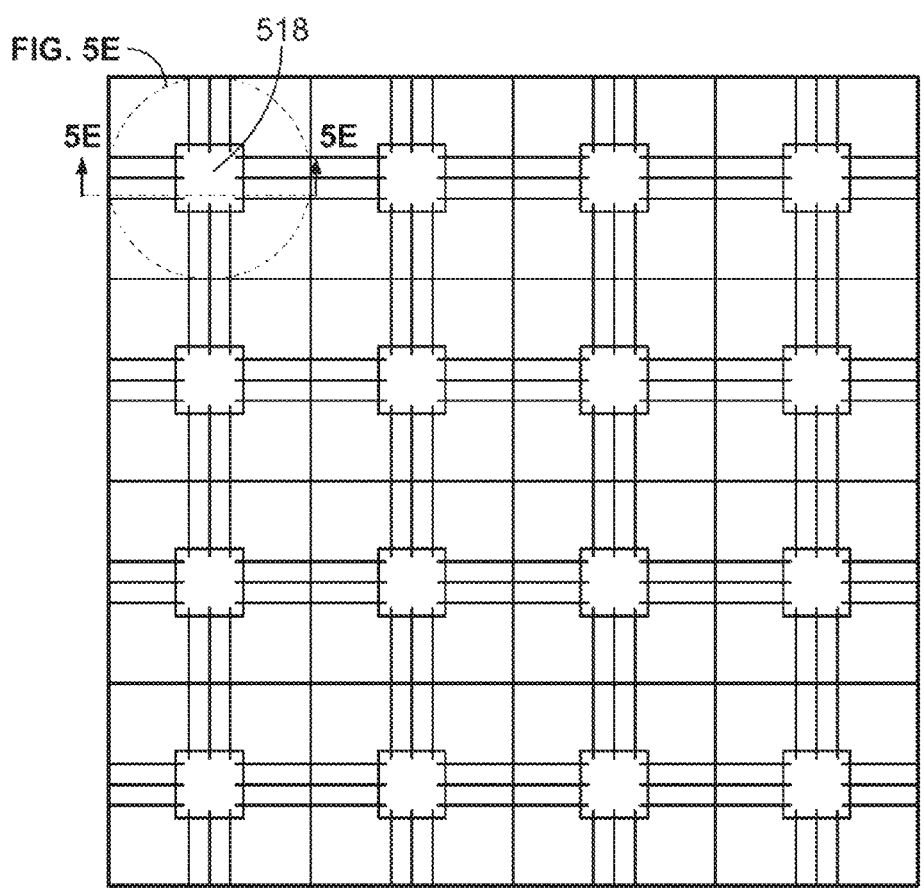
Figure 5B:
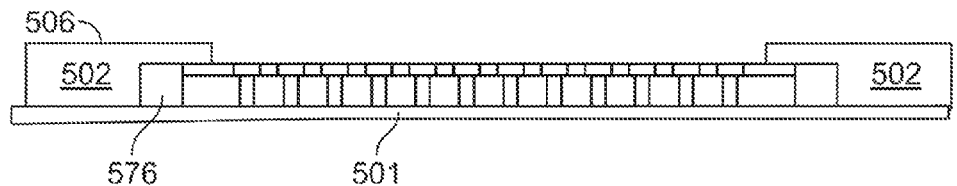
Figure 5C:
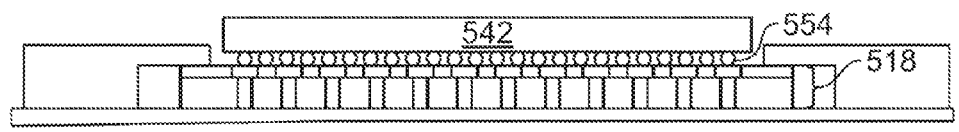
Figure 5D:
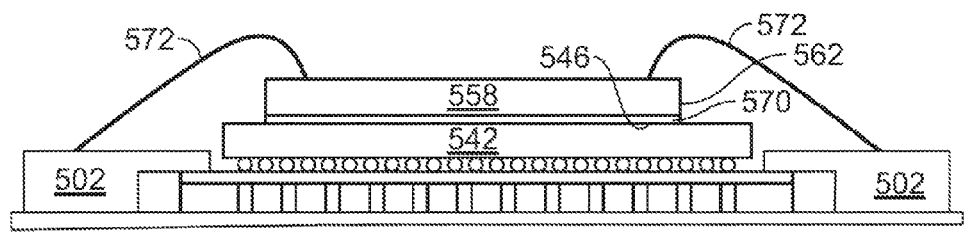

As discussed above, the microelectronic assembly 100 includes a lead frame 103 with lead fingers 102 (as depicted in plan view in FIGS. 5C-5D). In this particular embodiment, each of the lead fingers 102 has a first surface 104, a second surface 106, a fan-out portion 108 and a substrate connection portion 110.

Examples of lead frames and lead finger structures are shown and described in U.S. Pat. Nos. 7,176,506 and 6,765,287, the disclosures of which are hereby incorporated by reference herein. In general, a lead frame such as lead frame 103 is a structure formed from a sheet of conductive metal, such as copper, that is patterned into segments including a plurality of leads or conductive trace portions. Etching may also be used to achieve a lead finger having differing dimensions, as discussed herein. As shown, each fan-out portion 108 extends in a lead frame plane P. The fan-out portions 108 may have first and second opposed surfaces 104 and 106 and a first thickness T1 in a first direction between the opposed surfaces 104,106. Each fan-out portion 108 has a first dimension L1 in a second direction substantially parallel to the lead frame plane P. As used herein, "parallel" refers to axes extending through the structures' centroids being parallel or substantially parallel within an allowed tolerance, even if edges of the "parallel" structures are not entirely parallel. The fan-out portions 108 include electrically conductive terminals exposed at one or more of the first and second surfaces 104 and 106 for electrical interconnection with an external component such as a package substrate or a PCB. Stated another way, a part of the fan-out portion can remain exposed in the completed assembly, e.g., at surface 106, for use as a terminal configured for connection to an external component, e.g., another microelectronic assembly or circuit panel.

It is to be appreciated that in FIGS. 1 and 1A, the directions parallel to the first surface 104 are referred to herein as "horizontal" or "lateral" directions, whereas the directions perpendicular to the first surface 104 are referred to herein as "upward" or "downward" directions and are also referred to herein as the "vertical" directions. The directions referred to herein are in the frame of reference of the structures referred to. Thus, these directions may lie at any orientation to the normal or gravitational frame of reference. A statement that one feature is disposed at a greater height "above a surface" than another feature means that the one feature is at a greater distance in the same orthogonal direction away from the surface than the other feature. Conversely, a statement that one feature is disposed at a lesser height "above a surface" than another feature means that the one feature is at a smaller distance in the same orthogonal direction away from the surface than the other feature.

Substrate connection portions 110 extend in a lead frame plane P from a corresponding fan-out portion 108. The substrate connection portions 110 have a second thickness T2 in the first direction smaller than the first thickness T1. The substrate connection portions 110 have a second dimension L2 in the second direction smaller than the first dimension L1. The first surface 104 of the substrate connection portion 110 is coextensive and lies in the same plane as the first surface 104 of the fan-out portion. The substrate connection portions 110 define a recess 112 below the opposed second surface 114 of the substrate connection portions. The first surface 120 of the substrate 118 and the substrate connection portion 110 form a common interface for electrical connections to various other conductive structures for carrying an electronic signal potential to and from the first and second microelectronic elements 142,158.

Electrical connections may be provided to form an electrical connection between the second microelectronic element 158 and the lead fingers 102 of the lead frame. In one embodiment, wire bonds 172 may extend from the electrical contacts 168 exposed at the front face 160 of the second microelectronic element 158 directly to the lead fingers 102.

Figure 1B:
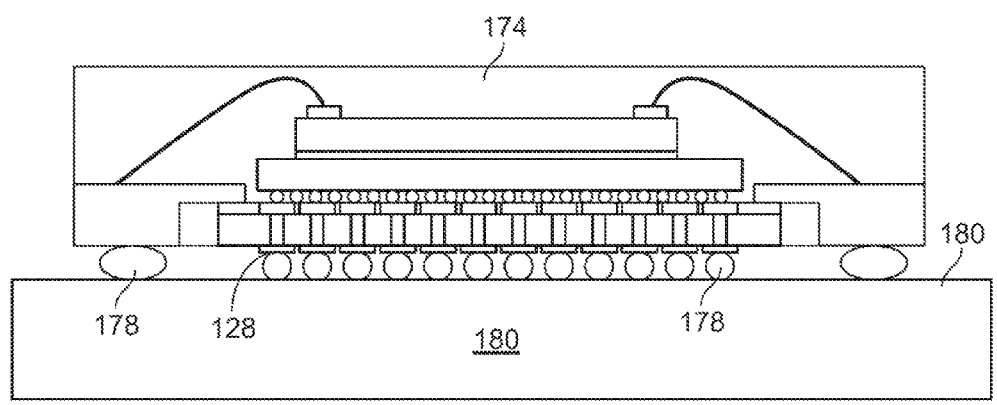
FIG. 1B is a cross-sectional view of an embodiment of the present invention.

An encapsulant 174 may be formed over microelectronic subassembly 116 including the electrical connections, such as wire bonds 172, the microelectronic elements therein, the substrate 118, the first surface 104 of the lead finger 102, and gaps 176 between the subassembly and the lead fingers 102. Referring to FIG. 1B, in one example, substrate 118 and a circuit board 180 or the like can be electrically interconnected. As shown, joining units such as solder balls 178 can be provided at the terminals 128 of the substrate 118, as well as on the lead finger 102 for joining with a circuit board, for example. It is to be appreciated that the microelectronic assembly 100 can be electrically connected to another device using any other available configuration including, for example, conductive posts, solder masses, stud bumps, flex connector, socketable contacts and the like.

Figure 2:
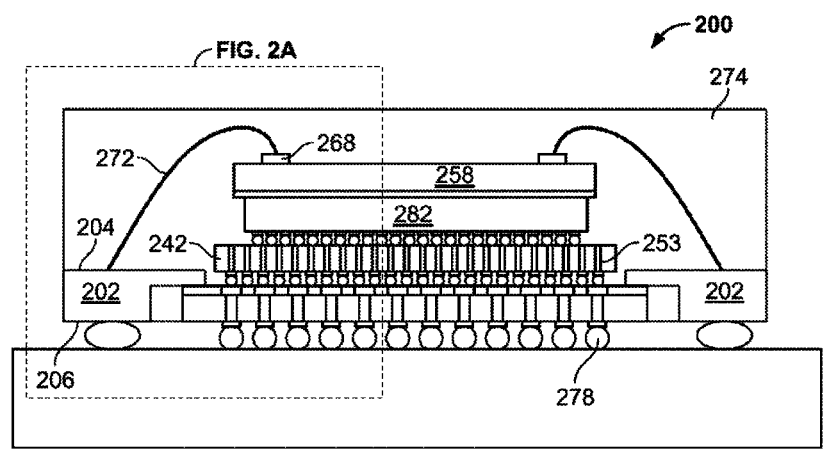
FIG. 2 is a cross-sectional view of another embodiment of the invention.
Figure 2A:
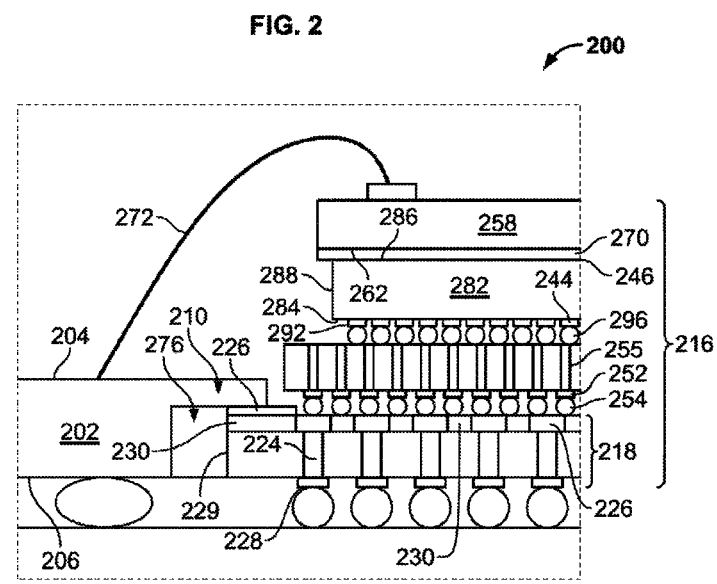
FIG. 2A is a fragmentary cross-sectional view, showing an enlarged view in greater detail of a portion of FIG. 2.

Referring now to FIGS. 2-2A, another microelectronic assembly 200, in accordance with an alternative embodiment of the present invention, is shown. It is to be appreciated that throughout the different embodiments described herein, similar reference numerals will be used to describe similar elements. This embodiment is similar to the one shown in FIG. 1, and only differs to the extent that the microelectronic subassembly 216 includes a first microelectronic element 242, a second microelectronic element 258, and an intermediate microelectronic element 282 positioned between the first and second microelectronic elements 242, 258. As in the previous embodiment, the substrate 218 can include conductive vias 224 and a metal layer 230. The first microelectronic element 242 is shown in a flip-chip orientation and electrically connected to the substrate contacts 226 through solder balls 254 positioned between the front face 244 of the first microelectronic element 242 and the first surface 220 of the substrate 218. Unlike the previous embodiment, the first microelectronic element 242 includes through silicon vias 255 to permit electrical interconnection through the first microelectronic element 242. In one embodiment, the through silicon vias 255 can be manufactured as disclosed in commonly owned U.S. patent application Ser. No. 13/051,414, filed on Mar. 18, 2011, and entitled "Stacked Microelectronic Assembly With TSVS Formed In Stages With Plural Active Chips," the disclosure of which is incorporated herein by reference. The intermediate microelectronic element 282 may also be positioned in a flip-chip or face-down orientation. As shown, solder balls 296 electrically connect electrical contacts 292 on the front surface 284 of the intermediate microelectronic element 282 to the substrate contacts 226. The rear surface 262 of the second microelectronic element 258 may be attached to the rear surface 286 of the intermediate microelectronic element 282 using an adhesive 270.

The microelectronic subassembly 216 is connected to a lead frame having lead fingers 202. The substrate connection portions 210 of the lead fingers 202 may be directly connected to substrate contacts 226 exposed at the first surface 220 of the substrate 218. A wire bond 272 may be used to electrically connect the second microelectronic element 258 to the lead fingers 202. An encapsulant 274 may be used to encapsulate the microelectronic subassembly 216, wire bonds 272, and any gaps 276 between the substrate 218 and the lead fingers 202.

Figure 3:
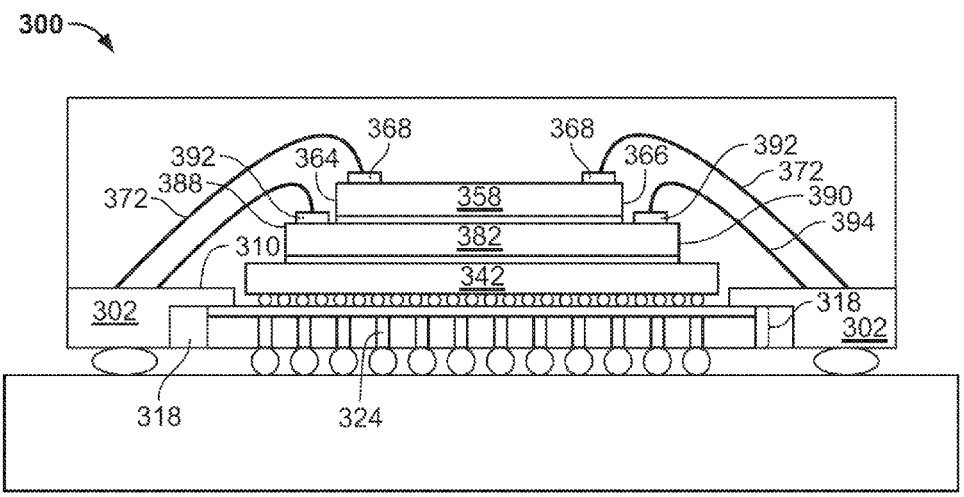
FIG. 3 is a cross-sectional view of another embodiment of the invention.

The particular arrangement of additional microelectronic elements that overlie the first microelectronic element 242 can vary widely. For example, with reference to FIG. 3, a microelectronic assembly 300, in accordance with an alternative embodiment of the present invention, is shown. In this embodiment, a first set of wire bonds 372 extends from electrical contacts 368 exposed at the front surface of the second microelectronic element 358 directly to the lead fingers 302. Similarly, a second set of wire bonds 394 extends from electrical contacts 392 on the intermediate microelectronic element 382 to the lead fingers 302.

In this embodiment, the first microelectronic element 342 is provided in a face-down position. The first microelectronic element 342 overlies substrate 318, which has conductive vias 324 extending therethrough. As shown, the first and second edges 388,390 of the intermediate microelectronic element 382 extend beyond the first and second edges 364,366 of the second microelectronic element 358. This allows space for the first and second sets of wire bonds 372,394 to connect the second microelectronic element 358 and intermediate microelectronic element 382 to the lead fingers 302. Alternatively, if it is desired to utilize microelectronic elements having the same or a similar size, the second microelectronic element and intermediate microelectronic element may be staggered or spacers can be positioned between the second microelectronic element 358 and the intermediate microelectronic element 382.

Figure 3A:
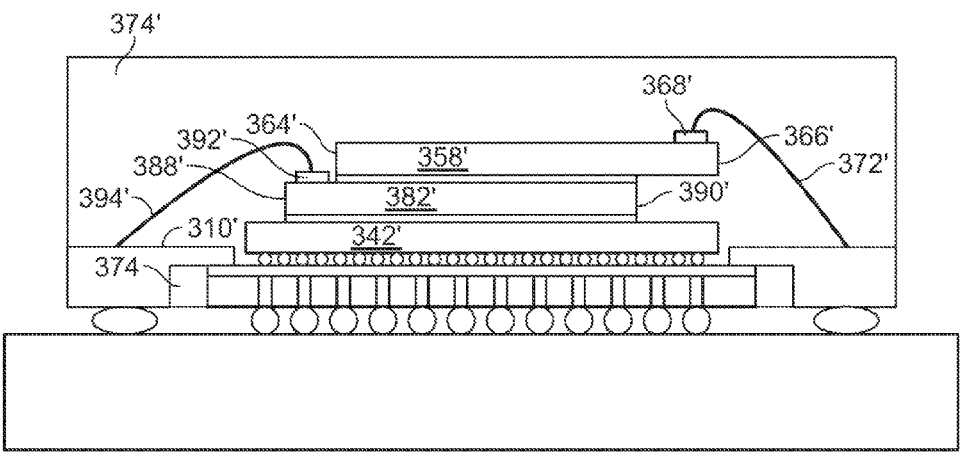
FIG. 3A is a fragmentary cross-sectional view, showing an enlarged view in greater detail of a portion of FIG. 3.

Referring now to FIG. 3A, there is shown an alternative stacked arrangement wherein second microelectronic element 358' and intermediate microelectronic element 382' are staggered. As shown, first edge 388' of the intermediate microelectronic element 382 extends beyond the first edge 364' of the second microelectronic element 358', but the second edge 390' of the intermediate microelectronic element 382' does not extend beyond the second edge 366' of the second microelectronic element 358'. Instead, the second edge 366' of the second microelectronic element 382' extends beyond the second edge 390' of the intermediate microelectronic element 382'. The intermediate microelectronic element 382' can be electrically connected to the substrate connection portion 310' of the lead finger 302' through a wire bond 394' that extends from a bond pad or electrical contact 392' on the intermediate microelectronic element 382' to the lead fingers. Similarly, the second microelectronic element 358' can be electrically connected to the lead fingers through a wire bond 372' that extends from a bond pad on the second microelectronic element directly to the lead frame.

Figure 3B:
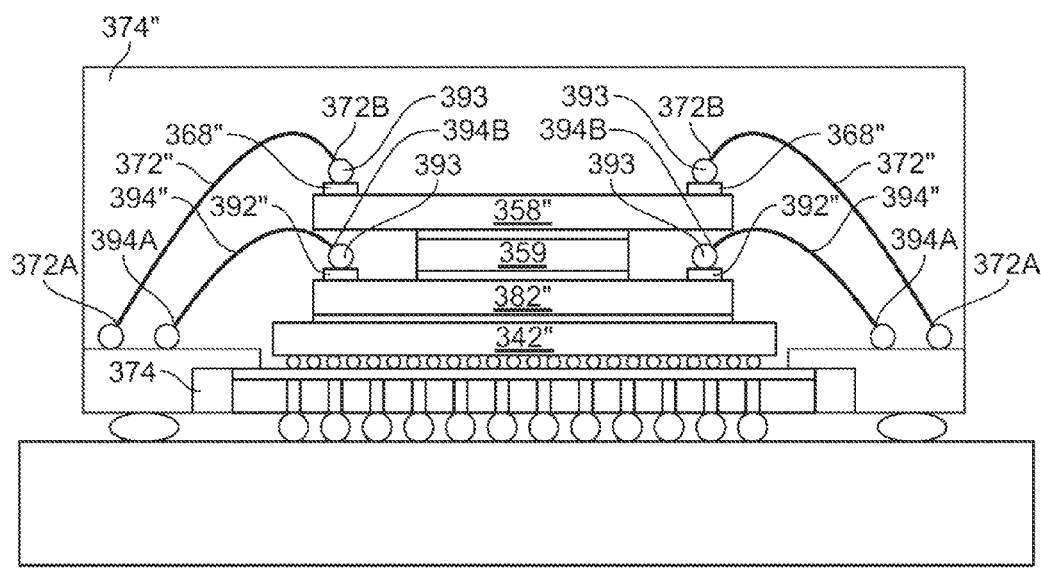
FIG. 3B is an alternative embodiment of FIG. 3.

In the alternative embodiment of FIG. 3B, the intermediate microelectronic element 382" and second microelectronic element 358" are directly stacked upon one another. A spacer 359 may be positioned between the intermediate microelectronic element and second microelectronic element to allow for wire bonds 394" to extend from bond pads or electrical contacts 392" on the intermediate microelectronic element 382" to the lead fingers 302". The spacer 359 may be fixed to the intermediate microelectronic element and second microelectronic element using a bonding material, such as an adhesive. In this embodiment, gold balls 393 may be provided on the bond pads 392" of the intermediate microelectronic element 382 and the bond pads 368" of the second microelectronic element 358". As shown, each of the wire bonds 372",394" extending from the lead fingers 302" has a first end 372A,394A bonded to the lead fingers 302" in the shape of a ball, and a second end 372B, 394B bonded to the gold ball on the intermediate microelectronic element and second microelectronic element in a wedge-shape fashion, such as described in U.S. Pat. No. 6,593,664 ("the '664 patent"), the disclosure of which is incorporated herein by reference. In an alternative embodiment, the second ends 372B,394B may be bonded to a metal layer disposed on the electrical contact 368" of the second microelectronic element 358" and/or the bond pads of the intermediate microelectronic element, as disclosed in the '664 patent.

Figure 4:
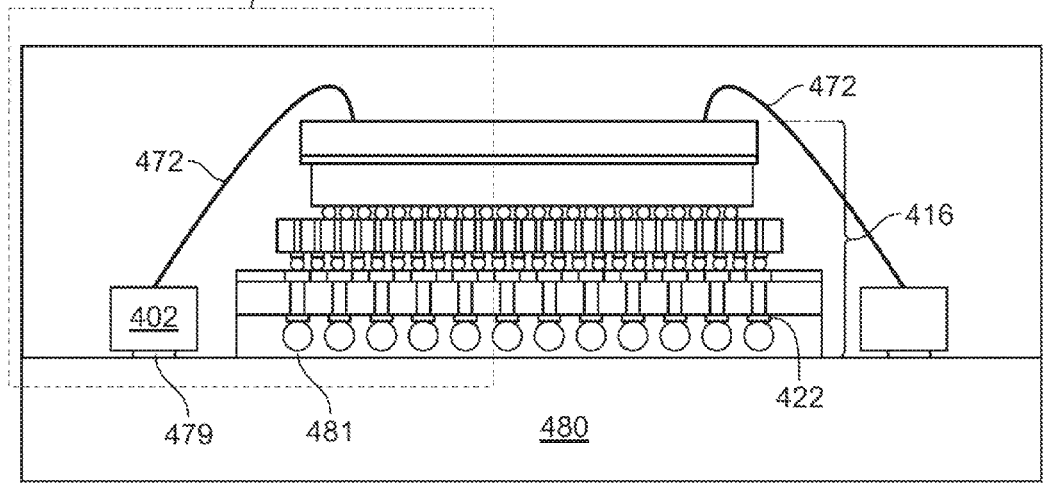
FIG. 4 is a cross-sectional view of another embodiment of the invention.
Figure 4A:
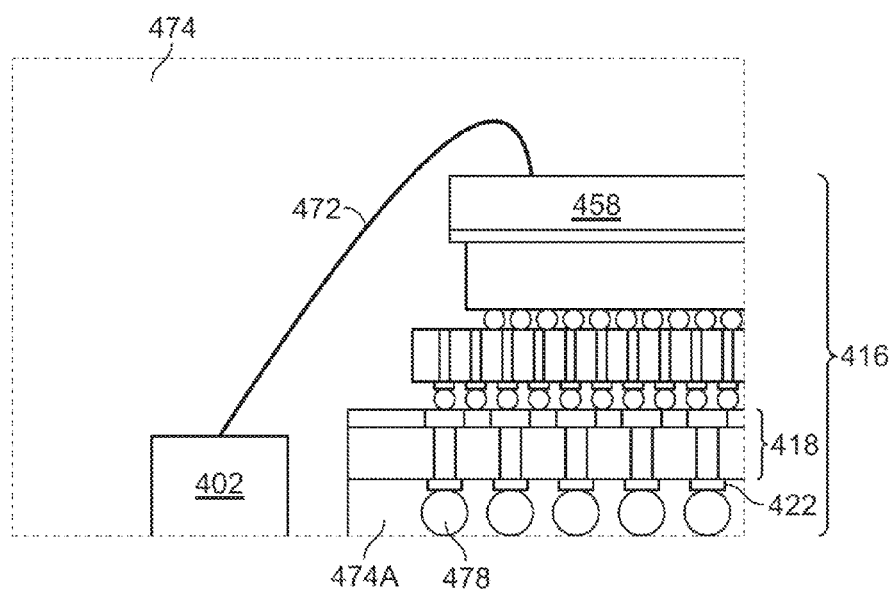
FIG. 4A is a fragmentary cross-sectional view, showing an enlarged view in greater detail of a portion of FIG. 4.

Turning now to the alternative embodiment shown in FIGS. 4-4A, this embodiment differs from the embodiment of FIG. 2 to the extent that the lead fingers 402 do not include a substrate connection portion, thereby preventing direct contact between the lead fingers 402 and the substrate 418. As shown, the lead fingers 402 are spaced away from the microelectronic subassembly 416 such that an encapsulant 474 will separate the lead fingers 402 and microelectronic subassembly 416. An electrical interconnection is therefore provided through the wire bonds 472 that extend between the lead finger 402 and the second microelectronic element 458. An electrical interconnection between the substrate 418 and the lead fingers 402 occurs through the solder balls 478 attached to terminals 428 on the substrate 418 that are electrically interconnected to contacts 481 on the circuit board 480 and the solder balls 478 on the lead fingers 402.

Figure 5E:
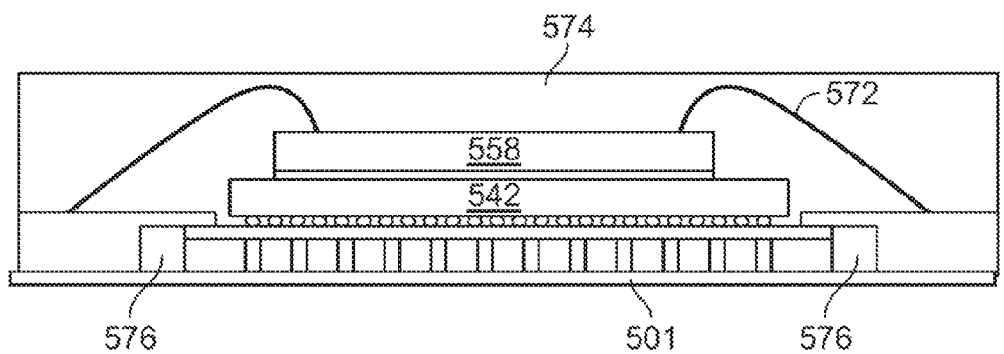
Figure 5F:
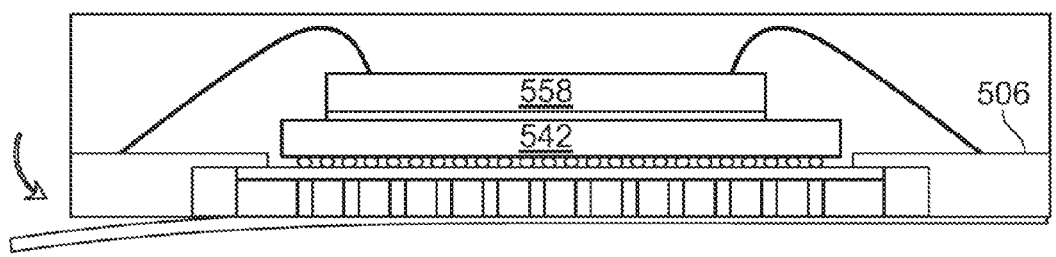
Figure 5G:
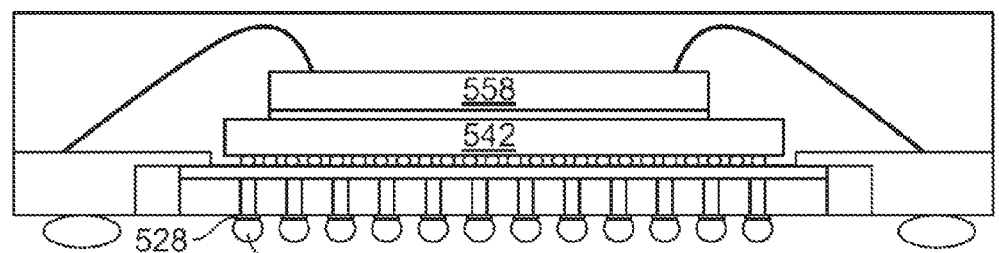

Turning now to FIGS. 5-5G, a method of making the microelectronic assembly 100 shown in FIG. 1 is shown. Referring to FIG. 5, an array of a plurality of lead frames 103 is shown. Each lead frame 103 is comprised of a plurality of lead fingers 502 attached to a temporary support element. Each lead finger 502 includes a fan out portion 508 and substrate connection portion 510 extending from the outer perimeter of the temporary support element toward the center of each individual lead frame. As shown in FIG. 5A, a plurality of substrates 518 (as disclosed herein) may be attached to the lead fingers 502 of each lead frame 103 in the array of lead frames.

Referring to FIG. 5B, an exploded view of a portion of FIG. 5, when the substrates 518 are attached to the lead fingers of the lead frame 503, a carrier 501 may be provided to support the lead finger 502 and the substrate 518. The embodiment shown in FIGS. 5A and 5B represent embodiments of an in-process unit that may be provided to third parties who can further package the in-process unit according to a certain set of requirements. In one example, the entire array of lead frames (FIG. 5A) may be provided to a third party as an in-process unit. The in-process unit may then be packaged with other microelectronic elements or devices according to a desired design specification, as will be described herein with reference to FIGS. 5C-G. Alternatively, if the in-process unit is not provided to a third party, the packaging process may simply continue, as further described herein with reference to FIGS. 5C-5G.

With the carrier 501 in place, microelectronic elements may be provided onto each of the lead frame configurations shown in FIG. 5D. For ease of discussion, FIGS. 5C-5G will illustrate only one lead frame, however, it is to be understood that in this embodiment, the arrangement of microelectronic elements can occur while the plurality of lead frames are provided in an array. Referring first to FIG. 5C, a first microelectronic element 542 may be provided over the substrate 518. The first microelectronic element 542 may be electrically connected to the substrate 518 through the use of a solder connection, such as solder balls 554. Turning next to FIG. 5D, a second microelectronic element 558 may be provided and overlie the first microelectronic element 542. In this embodiment, an adhesive material 570 is provided between the rear surface 562 of the second microelectronic element 558 and the rear surface 546 of the first microelectronic element 542. This allows for the rear surface 562 of the second microelectronic element 558 to become attached to the rear surface 546 of the first microelectronic element 542. Wire bonds 572 electrically connect the second microelectronic element 558 to the lead fingers 502.

Figure 6:
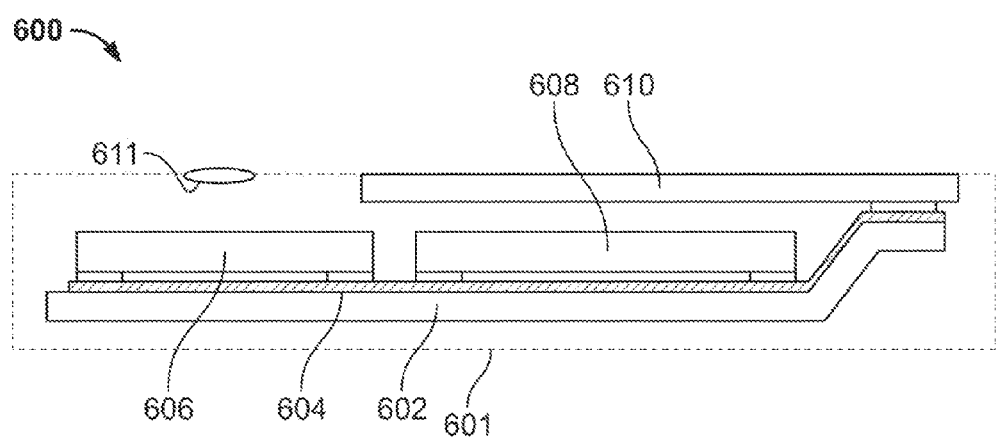
FIG. 6 is a cross-sectional view of a system incorporating an interconnection element.

Turning to FIG. 5E, after assembly of the first and second microelectronic elements 542,558, the first and second microelectronic elements 542,558, the wire bonds 572 connecting the first and second microelectronic elements 542, 558 to the lead fingers 502, and the gaps 576 between the lead finger 502 and substrate 518 are encapsulated as, for example, by introducing a flowable encapsulant 574 around the first and second microelectronic elements 542,558, the wire bonds 572 and lead frame. Due to the carrier 501, the encapsulation process is conducted so as to leave terminals 528 unexposed to and uncovered by the encapsulant 574. Alternatively, terminals contacts 528 can be provided after removal of the carrier 501. The carrier 501 may be removed after the encapsulation process, as shown in FIG. 5F. This will allow the second surface 506 of the lead finger 502 and the terminals 528 to be exposed. With reference to FIG. 5G, solder balls 578 may then be placed onto the terminals 528 and lead finger 502. Alternatively, other conductive connections, such as conductive posts, stud bumps, or the like, may be used. Additionally, the microelectronic assembly 500 may be aligned with conductive connections present on another device, such a circuit board or the like. The various microelectronic assemblies discussed above can be utilized in construction of diverse electronic systems. For example, referring to FIG. 6, a system 600 in accordance with a further embodiment of the invention includes a structure 606 as described in the prior embodiments of microelectronic assemblies above in conjunction with other electronic components 608 and 610. In the example depicted, component 608 is a semiconductor chip whereas component 610 is a display screen, but any other components can be used. Of course, although only two additional components are depicted in FIG. 6 for clarity of illustration, the system may include any number of such components. The structure 606 as described above may be, for example, a composite chip or a structure incorporating plural chips. In a further variant, both may be provided, and any number of such structures may be used. Structure 606 and components 608 and 610 are mounted in a common housing 601, schematically depicted in broken lines, and are electrically interconnected with one another as necessary to form the desired circuit. In the exemplary system shown, the system includes a circuit panel 602 such as a flexible printed circuit board, and the circuit panel includes numerous conductors 604, of which only one is depicted in FIG. 18, interconnecting the components with one another. However, this is merely exemplary; any suitable structure for making electrical connections can be used. The housing 601 is depicted as a portable housing of the type usable, for example, in a cellular telephone or personal digital assistant, and screen 610 is exposed at the surface of the housing. Where structure 606 includes a light-sensitive element such as an imaging chip, a lens 611 or other optical device also may be provided for routing light to the structure. Again, the simplified system shown in FIG. 6 is merely exemplary; other systems, including systems commonly regarded as fixed structures, such as desktop computers, routers and the like can be made using the structures discussed above.

As used in this disclosure, terms such as "upper," "lower," "upwardly" and "downwardly," and similar terms denoting directions, refer to the frame of reference of the components themselves, rather than to the gravitational frame of reference. With the parts oriented in the gravitational frame of reference in the directions shown in the figures, with the top of drawing being up and the bottom of the drawing being down in the gravitational frame of reference, the upper substrate is, indeed, above the lower substrate in the gravitational frame of reference. However, when the parts are turned over, with the top of the drawing facing downwardly in the gravitational frame of reference, the upper substrate is below the lower substrate in the gravitational frame of reference.

The foregoing descriptions of the preferred embodiments are intended to illustrate rather than to limit the present invention.

As these and other variations and combinations of the features discussed above can be utilized without departing from the present invention as defined by the claims, the foregoing description of the preferred embodiments should be taken by way of illustration rather than by way of limitation of the invention as defined by the claims.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A method of making a microelectronic assembly comprising:
   electrically joining some contacts of a substrate to respective first lead fingers of a lead frame, the substrate contacts facing the first lead fingers to which they are joined, the substrate having a plurality of the contacts at a first surface and a plurality of terminals at a second surface opposed to the first surface;
   aligning and joining element contacts at a front face of a first microelectronic element with corresponding substrate contacts underlying the element contacts;
   electrically interconnecting contacts at a face of a second microelectronic element facing away from the substrate with second lead fingers of the lead frame;
   forming a common interface for electrical interconnection to a component external to the microelectronic assembly along the second surface of the substrate and the bottom surface of the first lead fingers;
   aligning a bottom surface of the first lead fingers with the second surface of the substrate so that the bottom surface of the first lead fingers and the bottom surface of the substrate are coplanar and extend along a common plane parallel to a plane along which the front face of the first microelectronic element extends, the common interface being formed along the plane; and
   forming an encapsulant over the first and second microelectronic elements, exposed surfaces of the substrate and over the electrical connections between the second microelectronic element and the second lead fingers.

2. The method as claimed in claim 1, wherein a plurality of conductive vias and circuitry electrically connect the terminals with the contacts.

3. The method as claimed in claim 1, wherein a carrier is used to support the substrate and the first lead fingers.

4. The method as claimed in claim 3, wherein the carrier is removed after the step of forming an encapsulant.

5. The method of claim 1, wherein forming the encapsulant further comprises forming the encapsulant between the substrate and the first lead fingers, the encapsulant having a bottom surface formed along the plane.

6. The method of claim 1, further comprising forming the electrical connections between the second microelectronic element and the first lead fingers with wire bonds.

7. The method of claim 1, wherein forming the encapsulant comprises molding the encapsulant to have a planar surface overlying at least a portion of the second microelectronic element.

8. A method of making a microelectronic assembly comprising:
   electrically interconnecting contacts of a substrate with respective first lead fingers of a lead frame, the first lead fingers overlying the substrate contacts to which they are joined, the substrate having a plurality of the contacts at a first surface and a plurality of the terminals at a second surface opposed to the first surface;
   electrically connecting element contacts at a front face of a first microelectronic element with corresponding substrate contacts disposed at the first surface of the substrate;
   electrically interconnecting contacts at a face of a second microelectronic element and second lead fingers of the lead frame with wirebonds extending therebetween;
   aligning a bottom surface of the substrate with a bottom surface of the lead frame so that the bottom surfaces of the substrate and lead frame are coplanar and form a common interface for electrical interconnection to a component external to the microelectronic assembly along the second surface of the substrate and the bottom surface of the lead frame; and
   encapsulating the first and second microelectronic elements, exposed surfaces of the substrate, and the wirebonds extending between the second microelectronic element and the second lead fingers.

9. The method of claim 8, wherein the bottom surfaces of the lead frame and substrate extend along a common plane parallel to a plane along which the front face of the first microelectronic element extends.

10. The method of claim 8, further comprising positioning a third microelectronic element between the first and second microelectronic elements, element contacts of the third microelectronic element being electrically interconnected with rear contacts disposed at the rear face of the first microelectronic element.

11. The method of claim 8, further comprising positioning a third microelectronic element between the first and second microelectronic elements, and electrically connecting contacts disposed at a front face of the third microelectronic element with the first lead fingers and the second lead fingers.

12. The method of claim 11, further comprising electrically interconnecting the contacts of the third microelectronic element with the first and second lead fingers using wirebonds.

13. A method of manufacturing a microelectronic assembly comprising:
   positioning a substrate on a carrier layer, the substrate having contacts disposed at a top surface and terminals disposed at an opposed bottom surface;
   joining contacts of first lead fingers of a lead frame with the contacts disposed at the top surface of the substrate;
   positioning a first microelectronic element so that element contacts disposed at a front face of the first microelectronic element face the contacts disposed at the top surface of the substrate;
   positioning a second microelectronic element so that a rear face of the second microelectronic element faces the rear surface of the first microelectronic element, the rear face of the first microelectronic element being opposed to the front face;
   aligning a bottom surface of the first lead fingers with the bottom surface of the substrate on the carrier layer so that the bottom surface of the first lead fingers and the bottom surface of the substrate are coplanar and extend along a common plane parallel to a plane along which the front face of the first microelectronic element extends, the common interface being formed along the plane; and
   electrically interconnecting the second microelectronic element with the substrate contacts through the first lead fingers.

14. The method of claim 13, further comprising encapsulating exposed portions of the first and second microelectronic elements and the lead frame.

15. The method of claim 14, further comprising removing the carrier layer to expose the bottom surface of the substrate.

16. The method of claim 14, further comprising forming a common interface for electrical interconnection to a component external to the microelectronic assembly along the bottom surface of the substrate and the bottom surface of the first lead fingers.

* * * * *